United States Patent
Maruthamuthu et al.

(10) Patent No.: US 10,872,812 B2
(45) Date of Patent: Dec. 22, 2020

(54) HIGH-DENSITY METAL-INSULATOR-METAL (MIM) CAPACITORS

(71) Applicant: Intel IP Corporation, Santa Clara, CA (US)

(72) Inventors: Saravana Maruthamuthu, Munich (DE); Shankar Chandrasekaran Jayendra, Moosinning (DE); Shidlingeshwar Khatakalle, Gadhinglaj (IN)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 15/917,032

(22) Filed: Mar. 9, 2018

(65) Prior Publication Data
US 2019/0279899 A1   Sep. 12, 2019

(51) Int. Cl.
| H01L 21/768 | (2006.01) |
| H01L 49/02 | (2006.01) |
| H05K 1/16 | (2006.01) |
| H01G 4/30 | (2006.01) |
| H01G 4/232 | (2006.01) |
| H01G 4/012 | (2006.01) |
| H01L 21/3205 | (2006.01) |

(52) U.S. Cl.
CPC .... *H01L 21/76834* (2013.01); *H01L 21/3205* (2013.01); *H01L 21/76822* (2013.01); *H01L 21/76832* (2013.01); *H01L 28/40* (2013.01)

(58) Field of Classification Search
CPC .......... H01G 4/30; H01G 4/232; H01G 4/012; H01L 28/92; H01L 28/40; H01L 28/60; H01L 21/76834; H01L 21/76832; H05K 1/16; H05K 1/162
USPC .................. 361/321.1, 763, 761, 301.4, 303; 174/260
See application file for complete search history.

(56) References Cited

U.S. PATENT DOCUMENTS

| 2002/0039667 A1* | 4/2002 | Takaya | H01B 3/004 |
| | | | 428/824 |
| 2008/0264685 A1* | 10/2008 | Park | H05K 1/0236 |
| | | | 174/262 |
| 2009/0077800 A1* | 3/2009 | Randall | H01G 4/40 |
| | | | 29/854 |

* cited by examiner

*Primary Examiner* — Arun Ramaswamy
(74) *Attorney, Agent, or Firm* — Schwegman Lundberg & Woessner, P.A.

(57) ABSTRACT

Various embodiments include, for example, a noise suppression filter for a power-delivery network (PDN). In one exemplary embodiment, a capacitor device, which may be used as at least a portion of the noise suppression filter, includes a first conductive plate and a second conductive plate with a dielectric material formed between the first conductive plate and the second conductive plate. A floating conductive fill layer is formed within the dielectric material and between the first conductive plate and the second conductive plate. Other embodiments of capacitors, and methods of forming the capacitor, are disclosed.

25 Claims, 13 Drawing Sheets

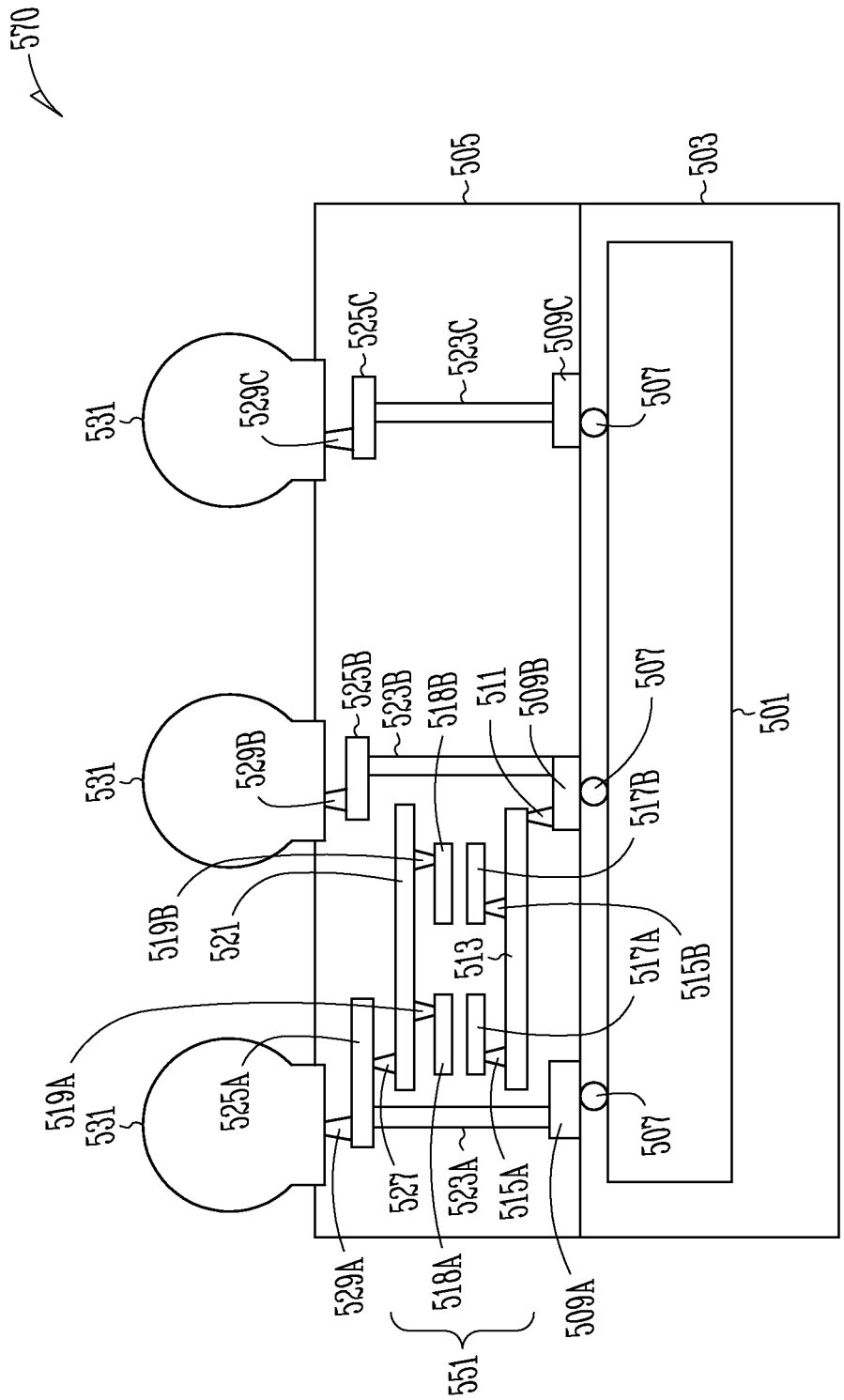

HIGH-DENSITY METAL-INSULATOR-METAL (MIM) CAPACITORS

TECHNICAL FIELD

The subject matter disclosed herein relates to semiconductor processing and, specifically, to formation of a capacitor.

BACKGROUND

Large surface-mounted capacitors (e.g., having a capacitance value of several micro-farads) mounted on a printed-circuit board (PCB) may be used as a part of a power-delivery network (PDN) in, for example, mobile phone platforms for power integrity. A traditional bypass capacitor of the PDN, placed in proximity to an integrated circuit (IC), can reduce noise on power supply rails by decoupling the power supply rails from transient signals generated by an integrated circuit (IC) block. The bypass capacitor decouples a current loop capable of generating transient signals into a smaller loop (e.g., in close proximity to the IC) to prevent or reduce noise on power supply traces powering the IC.

However, such capacitors are typically quite large. Consequently, the capacitors may take up a significant amount of area and package height on the PCB of, for example, mobile phones and other hand-held devices. Consequently, the large size of the bypass capacitor (e.g., a decoupling capacitor) can limit a form-factor shrink due to its large size. Further, to function effectively, the capacitor should be placed on power rails in close proximity to the ICs. This added limitation further prevents flexibility in laying out components on the PCB.

The information described in this section is given to provide the skilled artisan a context for the following disclosed subject matter and should not be considered as admitted prior art.

BRIEF DESCRIPTION OF THE FIGURES

FIGS. 5A through 5E illustrate cross-sectional views of an embodiment for fabricating the noise suppression filter of FIG. 4;

DETAILED DESCRIPTION

Figure 1A:
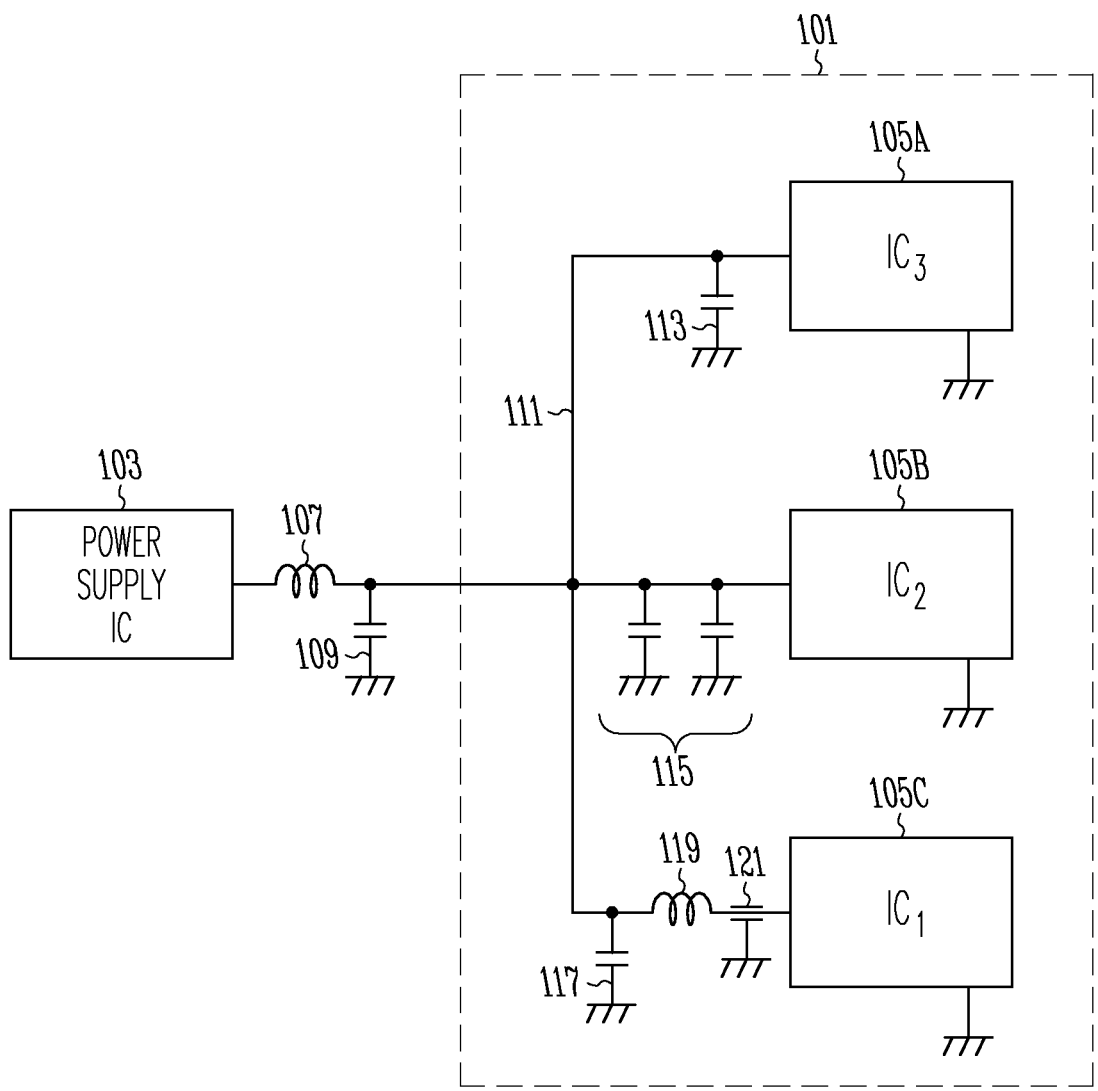
FIG. 1A illustrates a simplified example schematic of a power distribution network (PDN) using various examples of noise suppression filters.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

As noted above, the large volume (e.g., footprint area and height) of decoupling capacitors limit a form-factor shrink as well as limit a layout of the PCB. Contemporary solutions have focused on an integration of surface-mount device (SMD) capacitors into a package, mainly in a fan-out area of an embedded wafer-level package (eWLP). Other packaging technologies have focused on forming integrated package devices (IPDs) in a main package. However, neither solution fully addresses the large physical-volume concern presented by a large value of capacitance used for the decoupling capacitor.

For example, an integration of large capacitors into a package can increase the package height significantly, thereby limiting the form-factor shrink needed for new generations of electronic devices. Also, a bypass network, including a decoupling capacitor implemented as an IPD capacitor, implements a relatively long connection route between the IC and the IPD capacitor. The long connection increases inductance and fails to decouple transient signals coupling from the power supply to ICs as effectively as a decoupling capacitor mounted in close proximity to the ICs. Moreover, embedding IPDs into a larger package requires additional process steps, thereby increasing packaging costs.

The disclosed subject matter involves at least two devices and related methods by which a volume (e.g., area (footprint) and height) of the decoupling capacitor may be implemented while still maintaining a selected capacitance value. In one embodiment, a first device implements a floating metal fill in the dielectric between the metal-insulator-metal (MiM) capacitor plates. In another embodiment, a second device implements embedding a smaller MiM capacitor between the plates of a larger MiM capacitor. Each of these devices is described in more detail below. In still other embodiments, the first device and the second device are combined.

Further, although the various embodiments discuss devices and related methods for forming a decoupling capacitor in a PDN, a skilled artisan, upon reading and understanding the disclosure provided herein, will recognize that the disclosed capacitors may be used for a variety of applications in addition to use in a noise suppression filter as described. Therefore, the various capacitor devices and methods of formation will be described for use in a noise suppression filter only for ease of understanding for a particular application. However, the various embodiments are not so limited.

Referring now FIG. 1, illustrates a simplified example schematic of a power distribution network (PDN) 100 using various examples of noise suppression filters. FIG. 1 is shown to include a power supply integrated circuit (IC) 103, a power inductor 107, a smoothing capacitor 109, and a third IC 105A, a second IC 105B, and a first IC 105A. The power supply integrated circuit (IC) 103 and the three ICs 105A, 105B, and 105C may be various types of power supply and integrated circuits, respectively, known in the art.

A PDN circuit board 101 includes a number passive element noise suppression filters that are electrically coupled between the power supply integrated circuit (IC) 103 the three ICs 105A, 105B, and 105C by power supply wiring 111 (e.g., electrical traces on the PDN circuit board 101). The passive element noise suppression filters may be a variety of electromagnetic interference (EMI) filters known in the art.

For example, in various examples, a first passive element noise suppression filter may include a single decoupling capacitor 113. A second passive element noise suppression filter may include two or more decoupling capacitors 115 electrically coupled in parallel with one another. The skilled artisan will recognize that larger values of capacitance may be used to suppress noise signals from entering the ICs 105A, 105B. However, large capacitance values generally require a physically-larger capacitor. Such large capacitors are not desirable in devices such as mobile phones, as discussed above.

A third passive element noise suppression filter may include a composite decoupling circuit comprising a first capacitor 117 having a large-capacitance value, a ferrite bead 119, and a three-terminal capacitor 121 electrically coupled between the power supply 103 and the first IC 105C.

The various decoupling circuits can reduce or eliminate noise entering into an IC that was either generated external to the PDN circuit board 101, or generated within the PDN circuit board 101, or suppress transient current associated with various IC operations as is understandable to a person of ordinary skill in the art. As is further understood by the skilled artisan, more sophisticated decoupling circuits are used with integrated circuits having higher clock speeds. Operation of a simple capacitor-based decoupling circuit is discussed in more detail below with reference to FIGS. 2A and 2B.

With continuing reference to the composite decoupling circuit of FIG. 1A, the three-terminal capacitor 121 has input/output terminals drawing the "noise path" to within the three-terminal capacitor 121, and further reduces inductance. Further, the three-terminal capacitor 121 may take the place of two or more standard noise-suppression capacitors.

The ferrite bead 119 is electrically coupled serially between the power supply 103 and the first IC 105C. As show in FIG. 1A, the ferrite bead 119 serves as a noise suppression filter for the first IC 105C. However, the person of ordinary skill in the art will recognize that, used on its own, the ferrite bead 119 can present a high impedance source relative to the power supply 103 and can potentially interfere with proper operation of the first IC 105C. Therefore, the ferrite bead 119 is used along with the first capacitor 117 and the three-terminal capacitor 121 to form the noise suppression filter for the first IC 105C.

Figure 1B:
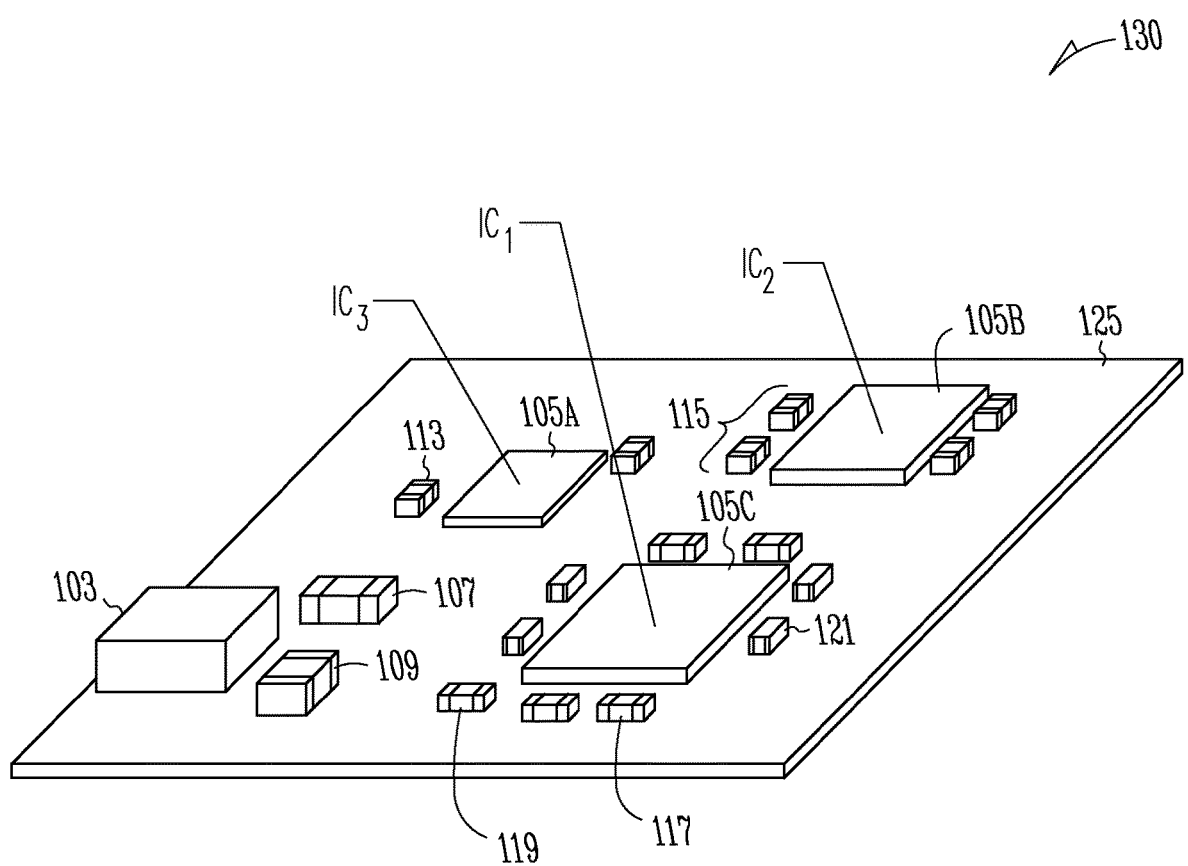
FIG. 1B illustrates a three-dimensional representation of the PDN of FIG. 1A.

FIG. 1B illustrates a three-dimensional representation 130 of the PDN 100 of FIG. 1A. FIG. 1B shows the components, represented schematically in FIG. 1A, mounted onto a printed circuit board 125. The three-dimensional representation 130 is exemplary only and many different physical layouts are possible. Any of the three noise-suppression circuits of FIGS. 1A and 1B may constructed using or more of the various exemplary embodiments described herein.

Figure 2A:
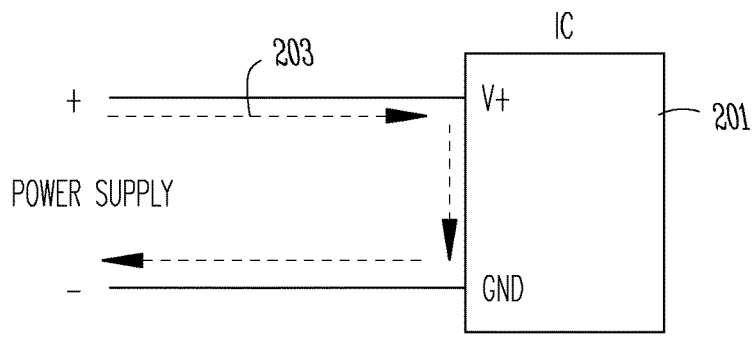
FIG. 2A illustrates an example of a supply current flowing in a circuit having no noise suppression filter.

To further exemplify various benefits of a decoupling capacitor as shown with reference to FIGS. 1A and 1B, FIG. 2A illustrates an example of a supply current 203 flowing in a circuit 200 having no noise suppression filter. A power supply (not shown explicitly) provides power to an IC 201. The supply current 203 may include transient voltages (e.g., noise) that flow in leads or electrical traces supplying power to the IC 201. Without any type of noise suppression filter (e.g., a decoupling circuit, such as a decoupling capacitor as described above with reference to FIGS. 1A and 1B), any transients or noise generated on the power-supplying leads will flow directly into the IC 201.

Figure 2B:
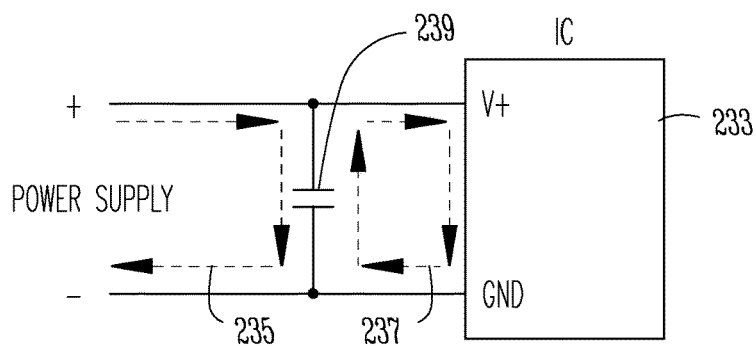
FIG. 2B illustrates an example of a supply current flowing in a circuit having a decoupling capacitor forming a noise suppression filter in accordance with various embodiments of the disclosed subject matter.

FIG. 2B illustrates an example of a supply current 235 flowing in a circuit 230 having a decoupling capacitor 239 forming a noise suppression filter in accordance with various embodiments of the disclosed subject matter. The decoupling capacitor 239 decouples the supply current 235 from current flowing in a smaller current loop 237 prior to entering an IC 233. The decoupling capacitor 239 eliminates or reduces an amplitude of transients and noise from the smaller current loop 237, thereby providing "cleaner" current to the IC 233.

Figure 3A:
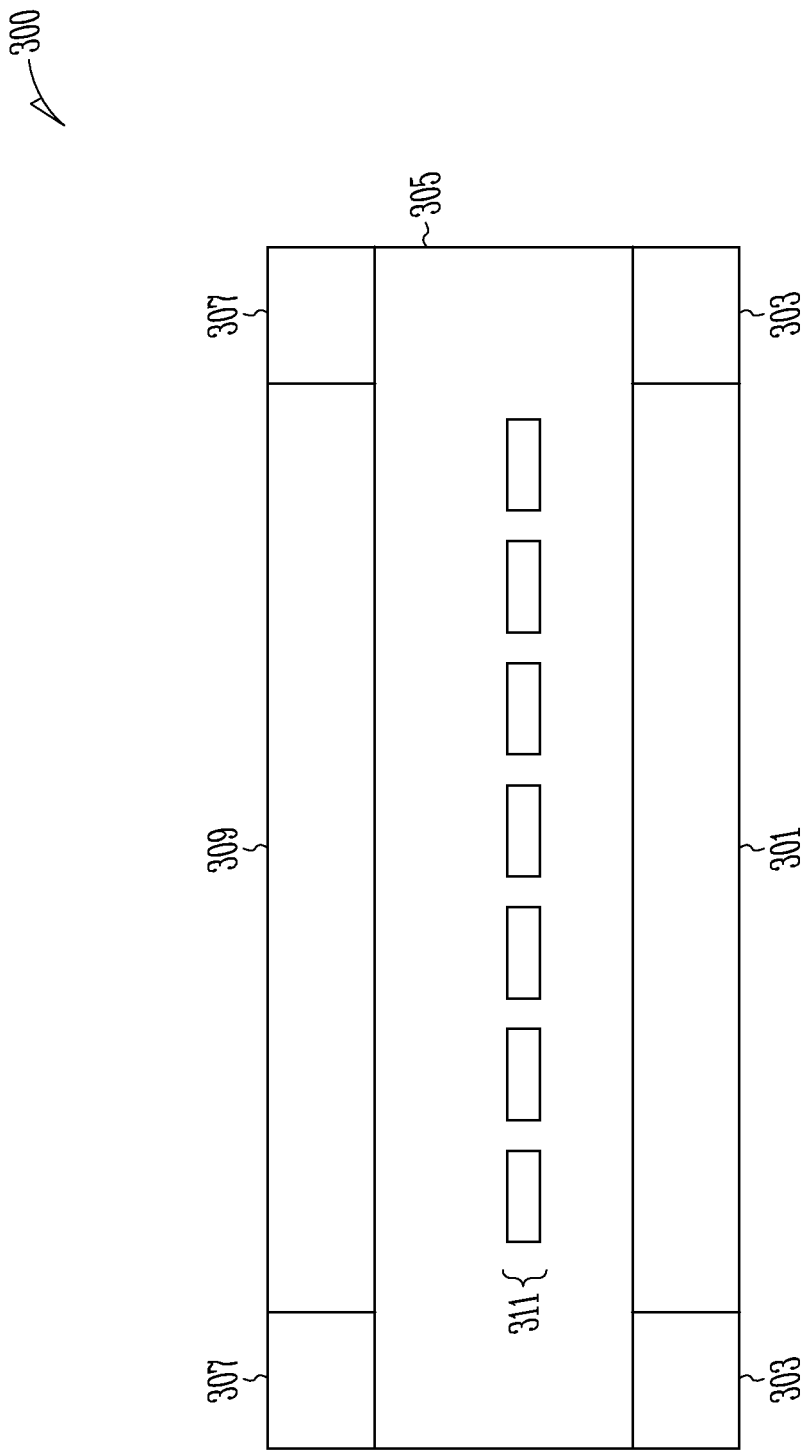
FIG. 3A illustrates a cross-sectional view of an exemplary embodiment of the noise suppression filter of FIG. 2B.

With reference now to FIG. 3A, a cross-sectional view of an exemplary embodiment of a noise suppression filter 300 (e.g., the decoupling capacitor 239) of FIG. 2B is illustrated. FIG. 3A is shown to include a first MiM plate 301, a second MiM plate 309, a dielectric material 305, and a floating conductive fill layer 311. As shown, in one embodiment, the floating conductive fill layer 311 may comprise a number of individual conductive portions, separated from one another by, for example, the dielectric material 305.

In one embodiment, each of the number of individual conductive portions is substantially in a single plane with others of the number of individual conductive portions. In other embodiments (not shown but readily understandable to a skilled artisan), the floating conductive fill layer 311 may comprise a single conductive portion surrounded by the dielectric material 305. In still other embodiments, the floating conductive fill layer 311 may comprise a number of individual conductive portions and one or more single conductive portions that are larger than the number of individual conductive portions. In still other embodiments, the floating conductive fill layer 311 may comprise a number of rows of a number of conductive portions, with each of the number of conductive portions within a row being substantially within a same plane (see, for example, FIG. 6). In still other embodiments, the floating conductive fill layer 311 may comprise a number of rows of a number of conductive portions, with each of the number of conductive portions being in substantially different planes.

The noise suppression filter 300 of FIG. 3A may optionally also include a first-layer dielectric material 303 electrically coupled to the first MiM plate 301 on, for example, at least two sides and a second-layer dielectric material 307 electrically coupled to the second MiM plate 309 on, for example, at least two sides.

At least one of the first MiM plate 301 and the second MiM plate 309 may comprise a redistribution layer (RDL). RDLs can be used to relocate contact pads or other types of input/output (IO) contacts to other physical locations (e.g., relocated substantially parallel to a substrate upon which the noise suppression filter 300 is formed). RDLs are known in the art.

Each of the first MiM plate 301, the second MiM plate 309, and the floating conductive fill layer 311 may comprise various types of conductive materials known in the art. For example, such conductive materials may include, but are not limited to, conductive materials including metals, transition metals, or oxynitrides of these metals used in standard semiconductor fabrication processes such as aluminum (Al), tungsten (W), tantalum (Ta), titanium (Ti), copper (W), platinum (Pt), silicon oxynitride ($SiO_xN_y$), and others. Each of the first MiM plate 301, the second MiM plate 309, and the floating conductive fill layer 311 may comprise the same, or different combinations of the conductive materials.

Each of the dielectric material 305, the first-layer dielectric material 303, and the second-layer dielectric material 307 may comprise various types of dielectric material. Dielectric materials such as, for example, silicon dioxide ($SiO_2$), silicon nitride ($Si_xN_y$) or a variety of other dielectric materials or ceramics such as tantalum pentoxide ($Ta_2O_5$), aluminum oxide ($Al_2O_3$), hafnium oxide ($HfO_2$), zirconium dioxide ($ZrO_2$), lanthanum oxide ($La_xO_y$), strontium titanate ($SrTiO_3$), strontium oxide (SrO), or combinations of these and other dielectric materials may be implemented.

The dielectric material 305, the first-layer dielectric material 303, and the second-layer dielectric material 307 may each be formed from the same material. Alternatively, each of the dielectric material 305, the first-layer dielectric material 303, and the second-layer dielectric material 307 may be formed from any of the other dielectric materials, or combinations thereof, as discussed above.

By introducing the floating conductive fill layer 311 within the dielectric material 305 and between the first MiM plate 301 and the second MiM plate 309, the effective dielectric constant of the dielectric increases, thereby increasing the capacitance per unit area.

Figure 3B:
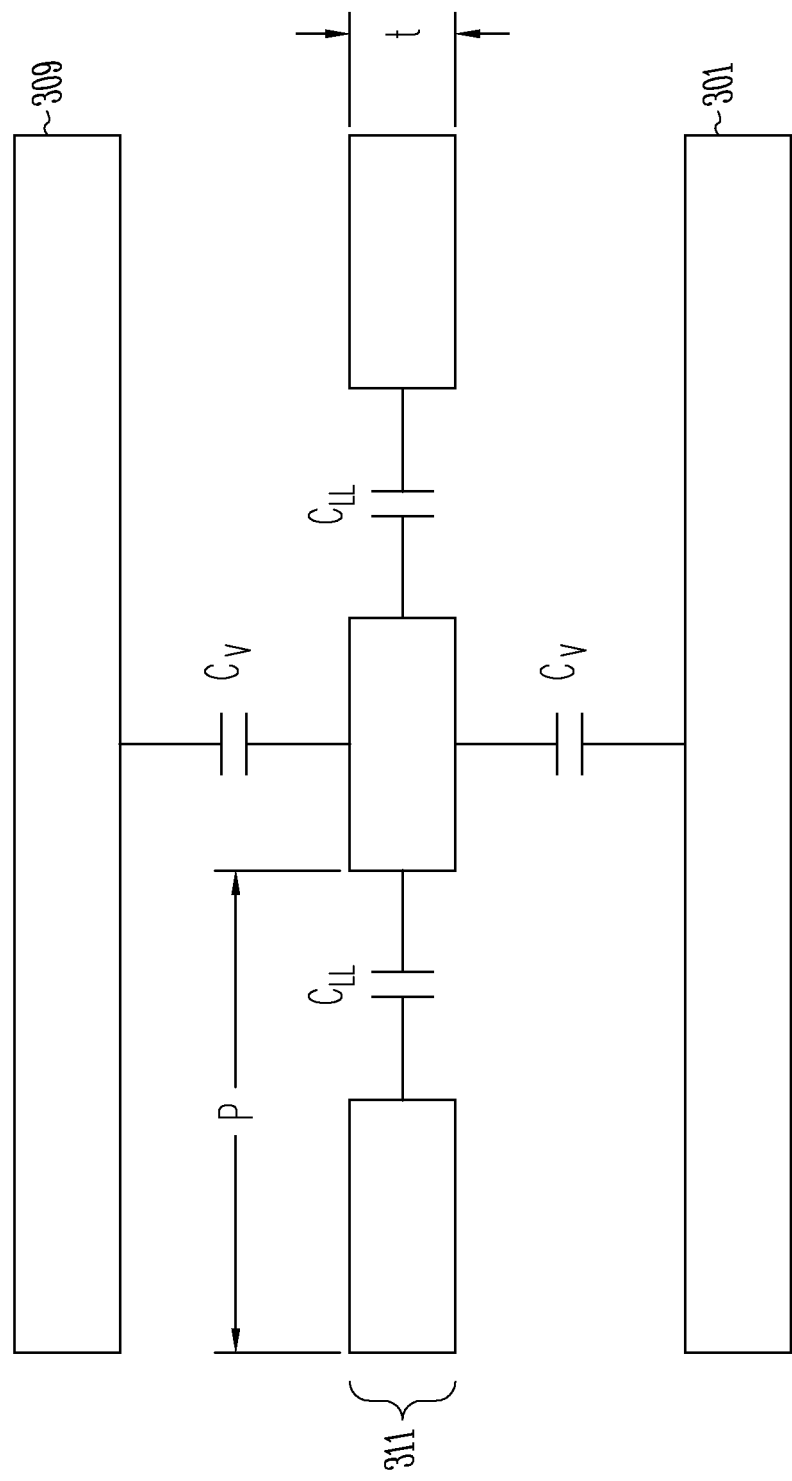
FIG. 3B illustrates an example schematic diagram used to determine a dielectric constant for the exemplary noise suppression filter of FIG. 3A.

FIG. 3B illustrates an example schematic diagram used to determine a composite dielectric constant for the exemplary noise suppression filter 300 of FIG. 3A that includes the floating conductive fill layer 311. For a constant pitch, P, and a constant thickness, t, of the floating conductive fill layer 311, a dielectric constant of the noise suppression filter 300 may be determined using electromagnetic simulation or resistance-capacitance extraction software, known in the art. In an exemplary embodiment, the composite dielectric constant may be calculated from the following equation:

$$C = C_{LL} + C_V$$

If the pitch, P, and the thickness, t, are not constant, a person of ordinary skill in the art will readily understand how to modify the equation above based on techniques and governing equations known in the art to determine the composite dielectric constant.

For example, as is readily understood by a person of ordinary skill in the art, a value of capacitance, C, increases with an area, A, of the plates, and decreases as a separation distance, d, between the plates is increased. Further, as a value of permittivity, ε, is increased, the value of the capacitance also increases according to the following equation:

$$C = \frac{\varepsilon A}{d} \quad (1)$$

Therefore, equation 1 indicates that a capacitance value may be increased by selecting a material with a high permittivity value for a dielectric material between the plates, increasing the physical area of the plates, and selecting a small separation distance between the plates. (The skilled artisan will recognize that the distance between the plates is chosen such that a dielectric breakdown does not occur based on a given voltage and dielectric material chosen.) Consequently, for a given application and a given set of operating parameters, the skilled artisan will recognize how various sizes and materials may be selected.

Figure 4:
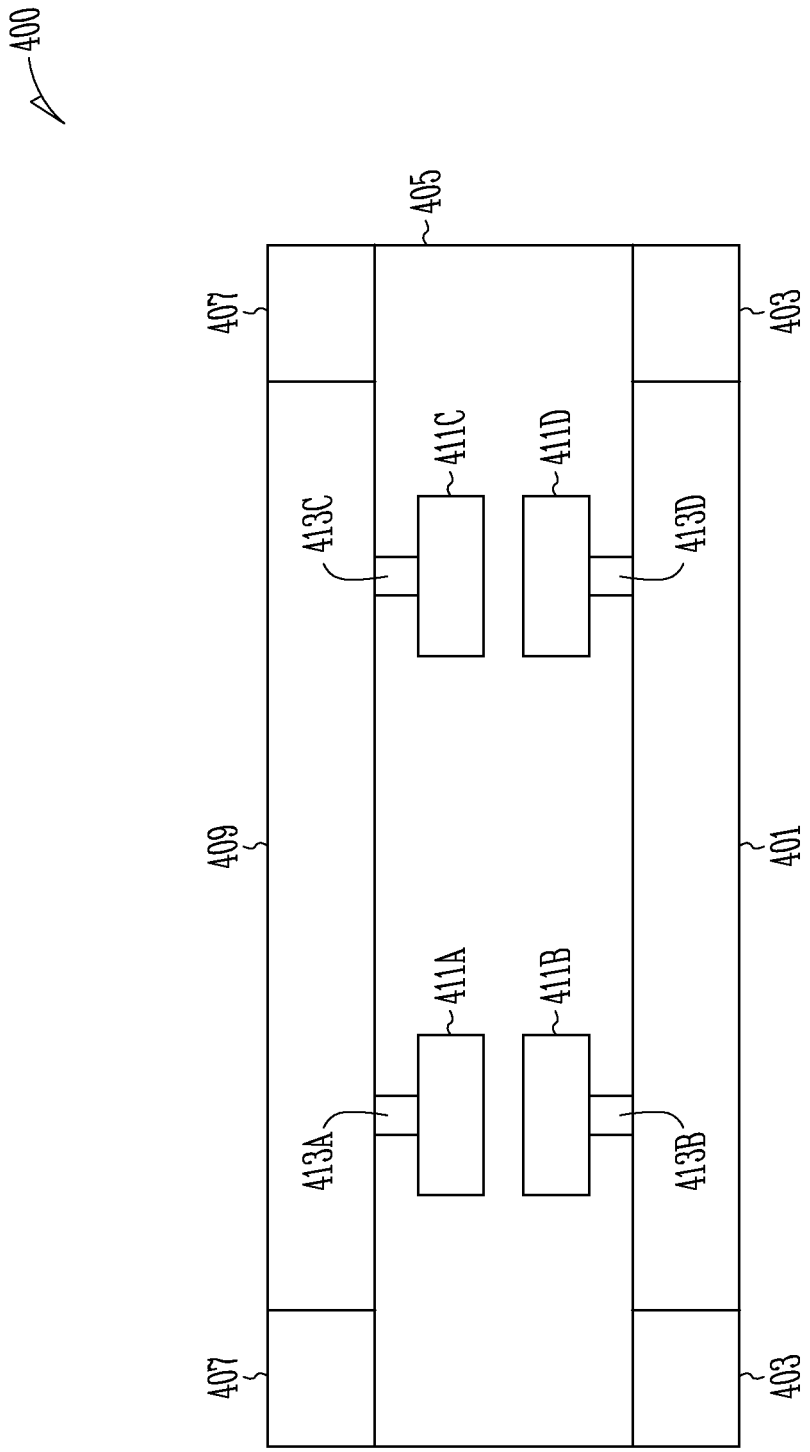
FIG. 4 illustrates a cross-sectional view of another exemplary embodiment of the noise suppression filter of FIG. 2B.

FIG. 4 illustrates a cross-sectional view of another exemplary embodiment of a noise suppression filter 400 (e.g., the decoupling capacitor 239 of FIG. 2B). FIG. 4 is shown to include a first main capacitor comprising a first MiM plate 401, a second MiM plate 409, and a dielectric material 405. Two smaller capacitors, each comprising an upper conductive plate 411A, 411C; a lower conductive plate 411B, 411D; and vias 413A through 413D filled with a conductive material coupling respective ones of the conductive plates 411A through 411D to either the first MiM plate 401 or the second MiM plate 409. A skilled artisan will recognize that a portion of the dielectric material 405 serves as a dielectric material between each of the smaller capacitors in addition to providing the dielectric material for the main capacitor.

Further, although only two smaller capacitors are shown, a skilled artisan will recognize that a smaller or large number of capacitors may be formed. For example, in one embodiment, a single capacitor may be formed with the first main capacitor. In other embodiments, three or more may be formed with the first main capacitor. In still other embodiments, more than one main capacitor may be formed, each having one or more smaller capacitors formed therein.

The noise suppression filter 400 of FIG. 4 may optionally also include a first-layer dielectric material 403 electrically coupled to the first MiM plate 401 on, for example, at least two sides and a second-layer dielectric material 407 electrically coupled to the second MiM plate 409 on, for example, at least two sides. As with the noise suppression filter 300 of FIG. 3A, each of the first MiM plate 401 and the second MiM plate 409 of the noise suppression filter 400 may comprise a redistribution layer (RDL).

Each of the first MiM plate 401, the second MiM plate 409, and the conductive plates 411A through 411D may comprise one or more of various types of conductive materials known in the art, such as those described above with reference to FIG. 3A. Each of the first MiM plate 401, the second MiM plate 409, and the conductive plates 411A through 411D may all comprise the same or different ones of the conductive materials. Additionally, the conductive material in the vias 413A through 413D may use the same or different materials as the first MiM plate 401, the second MiM plate 409, and the conductive plates 411A through 411D.

Further, each of the dielectric material 405, the first-layer dielectric material 403, and the second-layer dielectric material 407 may comprise various types of dielectric materials known in the art, such as those described above with reference to FIG. 3A. Each of the dielectric material 405, the first-layer dielectric material 403, and the second-layer dielectric material 407 may all comprise the same or different ones of the dielectric materials.

As will be understandable to a person of ordinary skill in the art, upon reading and understanding the disclosure provided herein, by further embedding one or more smaller MiM capacitors between the plates of a main MiM capacitor, an overall capacitance per unit area of the noise suppression filter 400 can be increased. As is further understandable to the skilled artisan, the noise suppression filter 400 arrangement of FIG. 4 can be implemented readily in a coreless substrate. Coreless substrate fabrication techniques involve forming build-up layers on a support. The coreless substrate fabrication techniques are known in the art and therefore will not be discussed in detail herein. However, the skilled artisan, upon reading and understanding the disclosure provided herein, will recognize how the disclosed subject matter may be implemented using coreless fabrication techniques.

In other embodiments (not shown explicitly but being understandable to a skilled artisan upon reading and understanding the disclosure provided herein), various embodiments of the noise suppression filter 300 of FIG. 3A described above can be combined with the noise suppression filter 400. Such combinations, as shown and described in more detail with reference to FIG. 6, below, can be used to increase further a capacitance density and, hence, a capacitance value.

Since various embodiments of capacitors described herein can utilize an entirety of a package area in X and Y, capacitors having large-capacitance values used for power delivery networks can be realized. Moreover, since various embodiments of the capacitors described herein can be coupled using, for example, package vias, the capacitors can be coupled in close proximity to various ICs (see, for example, FIG. 2B) to reduce or minimize transients and other noise from entering into the ICs. Consequently, various embodiments of the disclosed subject matter provide a novel means for a circuit designer to meet power integrity guidelines set by end users, such as manufacturers of a given device (e.g., a mobile phone).

Further, by implementing one or more of the various embodiments of the disclosed subject matter presented herein, a significant savings in both area (e.g., an X-Y footprint of a noise suppression filter) and volume (e.g., the area combined with a height of the noise suppression filter) on, for example, a PCB or on a die, can be realized. The savings in area and volume can assist greatly in meeting future generations of various form-factor shrinks.

Referring now to FIGS. 5A through 5E, cross-sectional views of an embodiment for fabricating the noise suppression filter 400 of FIG. 4 are illustrated. Since standard fabrication techniques known in the art (e.g., deposition, lithography, planarization steps, etc.) may be used to produce the noise suppression filter 400, such details will not be covered herein.

Figure 5A:
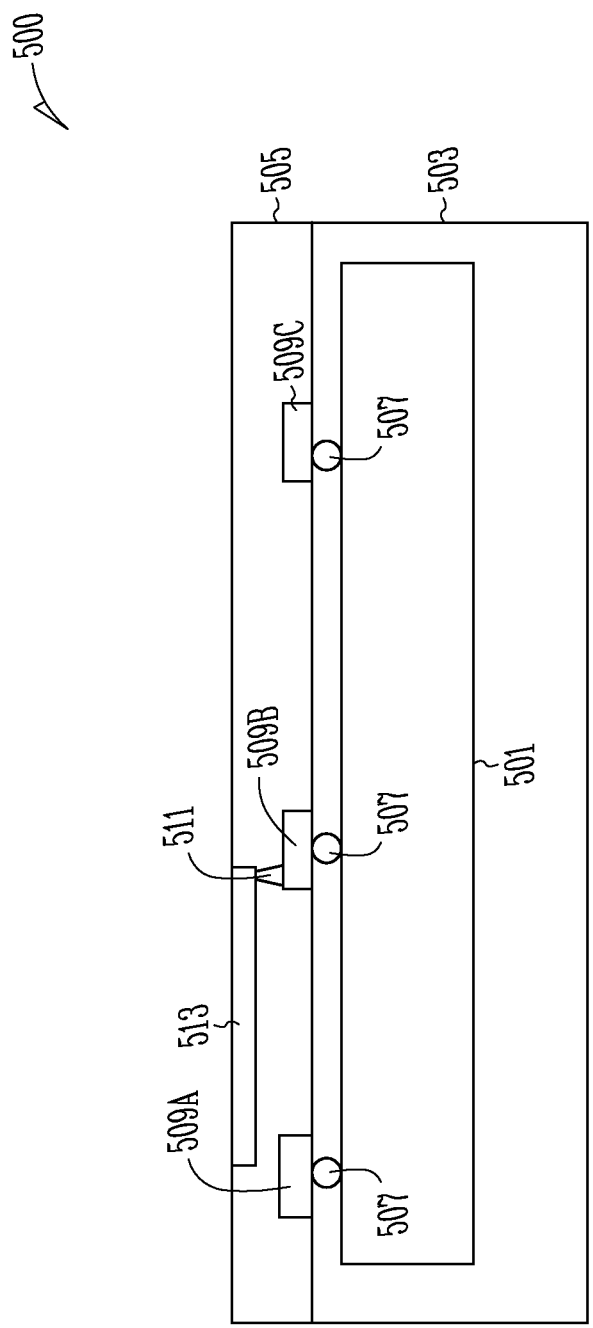

For example, FIG. 5A shows a first portion 500 of a package including a die 501, a first dielectric material 503 at least partially surrounding the die 501, lead lines or electrical traces 509A through 509C, a second dielectric material 505, and a bottom MiM plate 513. The bottom MiM plate 513 may the same as or similar to the first MiM plate 401 of FIG. 4.

The die 501 is electrically coupled to a number of lead lines or the electrical traces 509A through 509C through a number of interconnects 507. The interconnects 507 can be any type of electrical contact point known in the art such as various types of contact pads, solder balls (including controlled-collapse chip-connection (C4), wire bonds, and others). At least one of the electrical traces 509A through 509C (e.g., the electrical trace 509B) may carry power such as $V_{SS}$. As shown in FIG. 5A, the bottom MiM plate 513 may be electrically coupled to the electrical trace 509B through a via 511 filled with a conductive material.

In one embodiment, the first dielectric material 503 and the second dielectric material 505 may comprise any of the dielectric materials described herein. In other embodiments, the first dielectric material 503 may comprise an encapsulant, also known in the art.

Figure 5B:
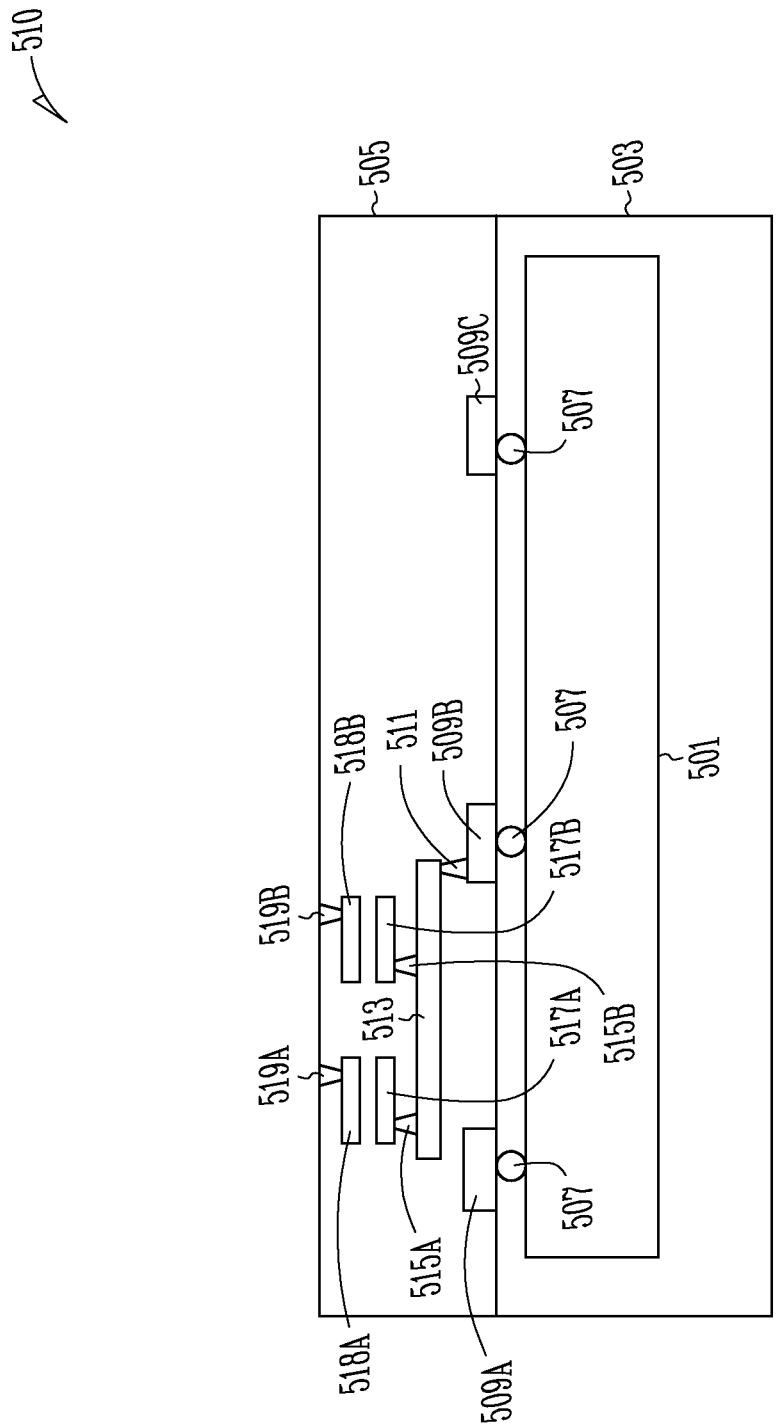

With continuing reference to FIG. 5A, FIG. 5B shows a second portion 510 of a package in which two smaller capacitors are formed. Each of the two smaller capacitors comprise an upper conductive plate 518A, 518B; a lower conductive plate 517A, 517B; and lower vias 515A, 515B filled with a conductive material that electrically couple the lower conductive plate 517A, 517B to the bottom MiM plate 513.

Figure 5C:
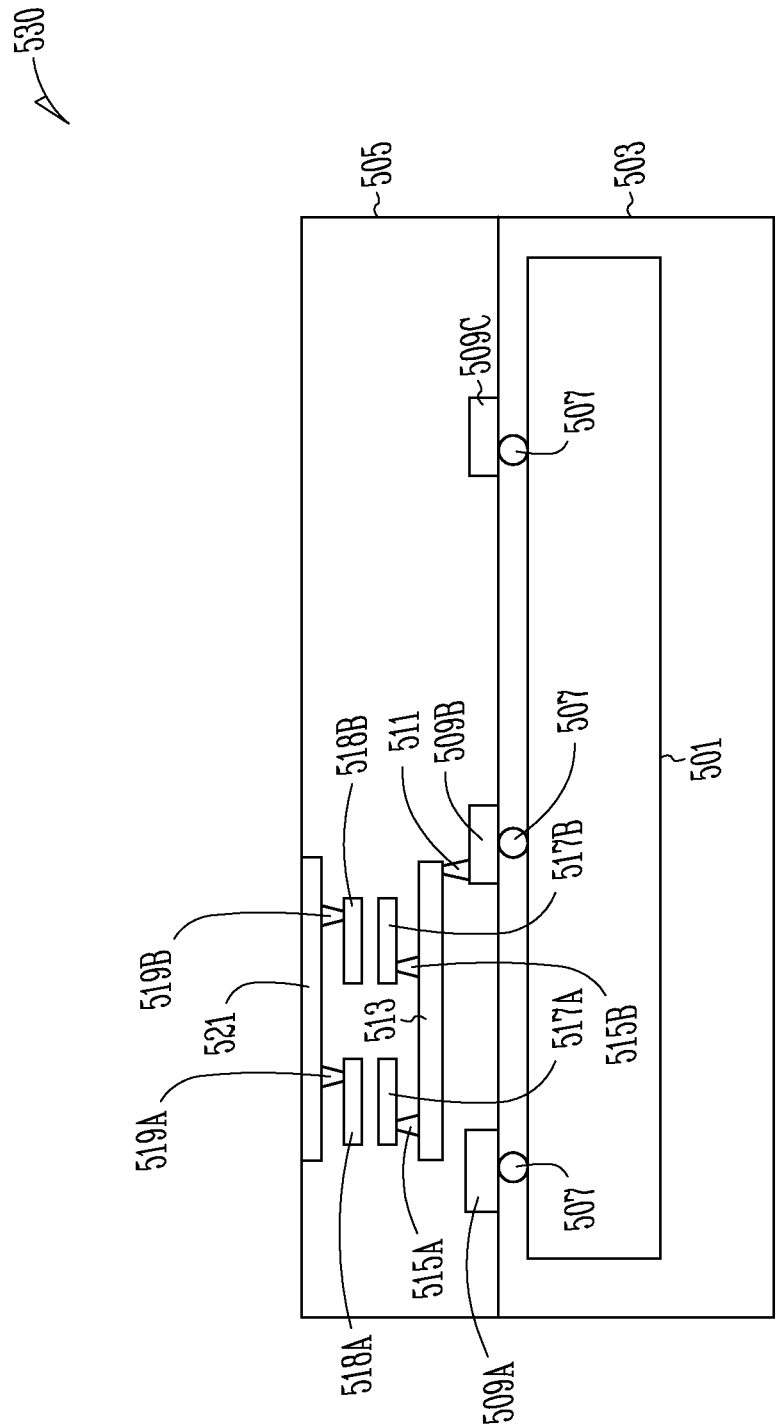

Additionally, FIG. 5B is also shown to include upper vias 519A, 519B, each filled with a conductive material, that electrically couple the upper conductive plates 518A, 518B to an upper MiM plate 521 as shown in a third portion 530 of a package with reference to FIG. 5C. Consequently, a first main capacitor of FIGS. 5A through 5C comprises the bottom MiM plate 513, the upper MiM plate 521, and the second dielectric material 505.

The smaller capacitors each comprise the lower conductive plates 517A, 517B; the upper conductive plates 518A, 518B; and a portion of the second dielectric material 505. As is described with reference to FIG. 4, above, the third portion 530 of the package may include more than one main capacitor and a larger or smaller number of smaller capacitors.

Each of the bottom MiM plate 513, the upper MiM plate 521, the lower conductive plates 517A, 517B; and the upper conductive plates 518A, 518B may comprise one or more of various types of conductive materials known in the art, such as those described above with reference to FIG. 3A.

Figure 5D:
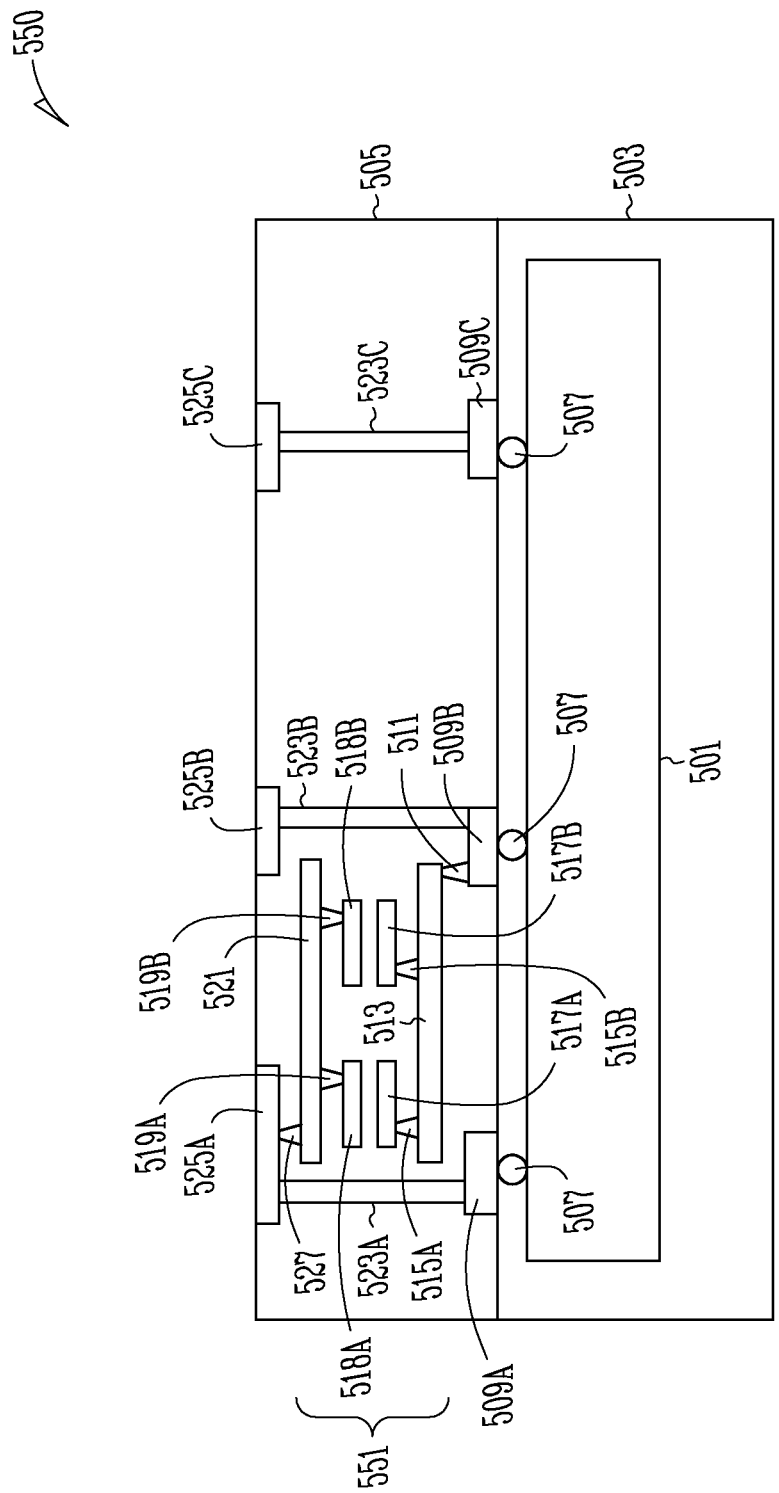

Referring now to FIG. 5D, as shown, additional interconnects are added to a cross-sectional view of a fourth portion 550 of a package. The additional interconnects include a number of upper lead lines or electrical traces 525A through 525C, and an upper via 527, filled with a conductive material, electrically coupled between the upper trace 525A and the upper MiM plate 521. Further, a number of through-package vias 523A through 523C, each filled with a conductive material, are shown electrically coupled between the traces 525A through 525C and the lower traces 509A through 509C.

For example, the through-package via 523A may supply power (e.g., $V_{DD}$) from the upper trace 525A to the die 501 through the through-package via 523A, the lower trace 509A, and the interconnect 507 that is electrically coupled to the lower trace 509A. A conductively-filled via 527 via may also supply power (e.g., $V_{DD}$) from the upper trace 525A to the upper MiM plate 521

With continuing reference to FIG. 5D, the fourth portion 550 of the package provides an exemplary embodiment of a MiM-in-MiM capacitor 551. Although not shown in detail, slots may be fabricated in any of the various levels (e.g., through capacitor plates) of the package to allow vias to extend through various ones of the MiM plates while not electrically coupling the via to the MiM plate. Such techniques for forming slots are known in the art.

FIG. 5E shows a cross-sectional view of a completed package 570. FIG. 5E is shown to include a number of interconnects 531, each electrically coupled to various portions of the completed package 570 through a number of vias 529A through 529, each filled with a conductive material. The interconnects 531 may comprise various types of contact pads, solder balls (such as C4 interconnects), wire bonds, and other types of interconnect known in the art.

Figure 6:
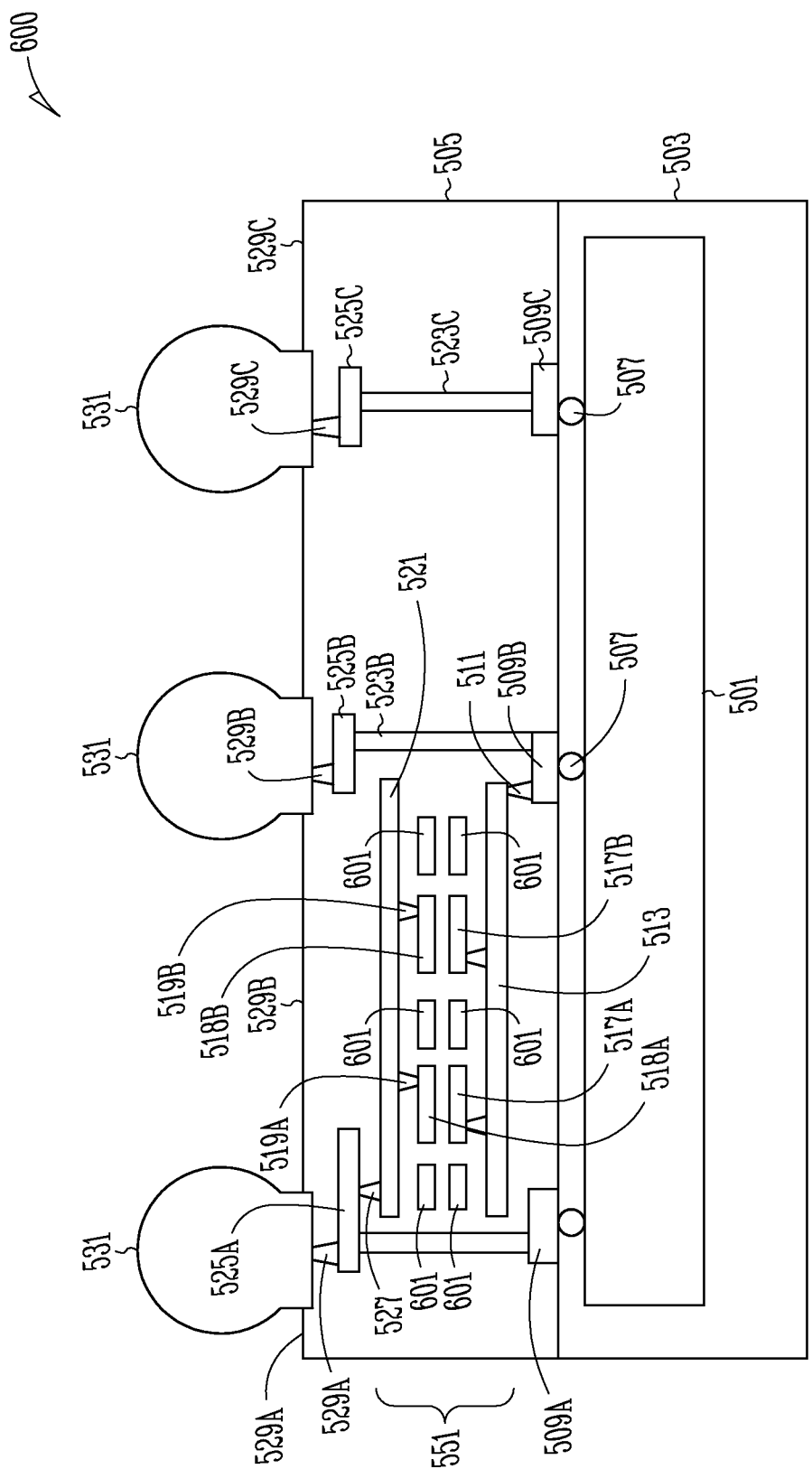
FIG. 6 illustrates a cross-sectional view of an embodiment using a combination of the noise suppression filters of FIGS. 3, 4, and 5A-5E.

Referring now to FIG. 6, a cross-sectional view 600 of an embodiment using a combination of the noise suppression filters of FIGS. 3, 4, and 5A-5E is illustrated. With continuing reference to FIGS. 5A through 5C, FIG. 6 is shown to include a number of floating conductive lines 601. The conductive lines may be the same as or similar to the floating conductive fill layer 311 of FIG. 3A. Consequently, the floating conductive lines 601 increase a total value of capacitance of the MiM-in-MiM capacitor 551 as explained above with reference to FIG. 3A. In various embodiments, and although not shown explicitly in FIG. 6 but readily understood by a person of ordinary skill in the art, one or more additional floating conductive lines may be formed between the lower conductive plates 517A, 517B and the upper conductive plates 518A, 518B of one or more of the smaller capacitors.

Figure 7:
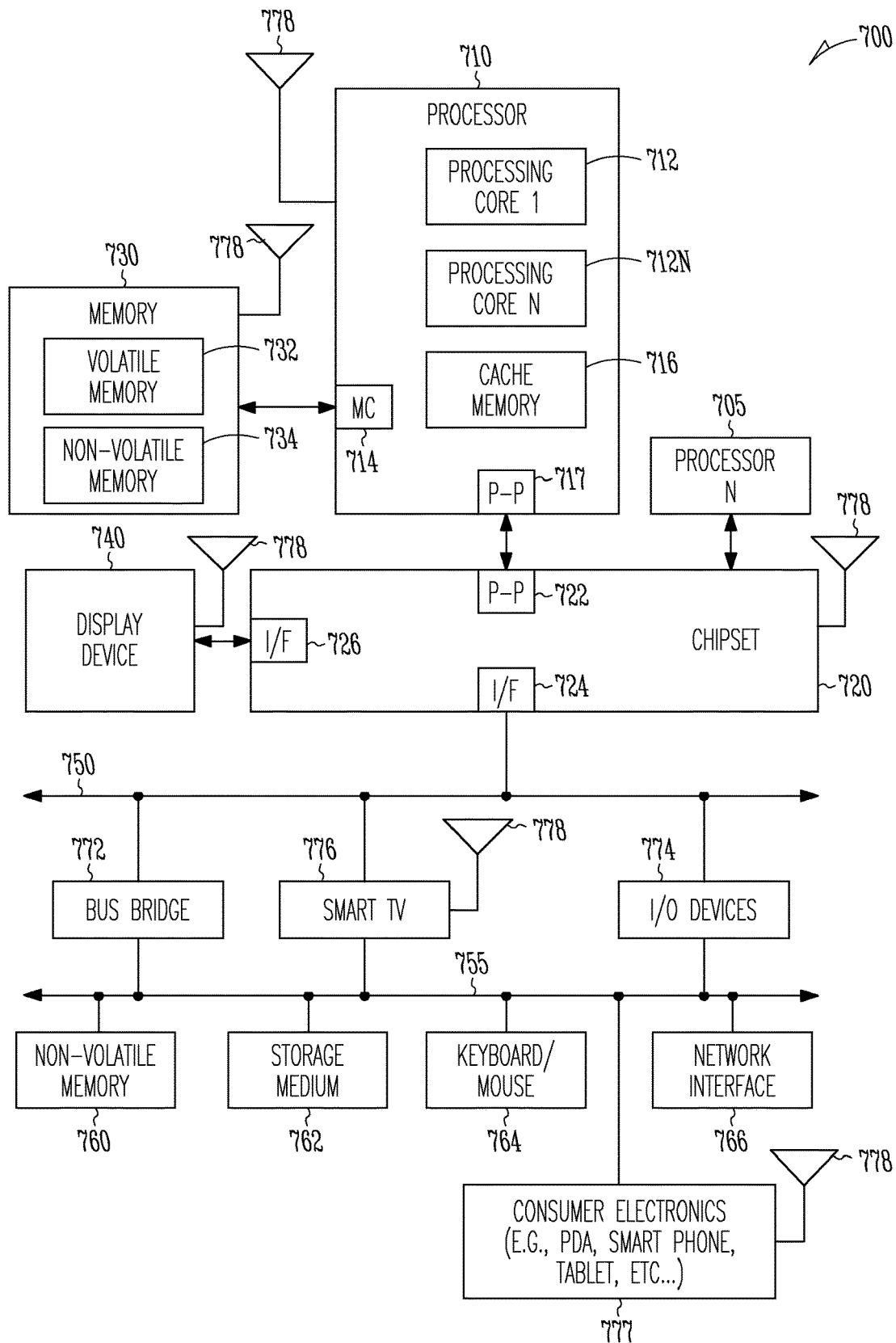
FIG. 7 illustrates a system level diagram, depicting an example of an electronic device (e.g., a system) including the noise suppression filter as described herein.

FIG. 7 illustrates a system level diagram, depicting an example of an electronic device (e.g., a system) including the noise suppression filter (e.g., various embodiments of the decoupling capacitor) as described herein in the present disclosure. FIG. 7 is shown to include an example of a higher-level device application for the capacitor. In one embodiment, a system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, the system 700 is a system on a chip (SOC) system.

In one embodiment, a processor 710 has one or more processor cores 712, 712N, where the processor core 712N represents the $N^{th}$ processor core inside the processor 710, where N is a positive integer. In one embodiment, the system 700 includes multiple processors including the processor 710 and a processor N 705, where the processor N 705 has logic similar or identical to the logic of the processor 710.

In some embodiments, the processor core 712 includes, but is not limited to, pre-fetch logic to fetch instructions, decode logic to decode the instructions, execution logic to execute instructions, and the like. In some embodiments, the processor 710 has a cache memory 716 to cache instructions and/or data for the system 700. The cache memory 716 may be organized into a hierarchal structure including one or more levels of cache memory.

In some embodiments, the processor 710 includes a memory controller 714, which is operable to perform functions that enable the processor 710 to access and communicate with memory 730 that includes a volatile memory 732 and/or a non-volatile memory 734. In some embodiments, the processor 710 is coupled with the memory 730 and a chipset 720. The processor 710 may also be coupled to a wireless antenna 778 to communicate with any device configured to transmit and/or receive wireless signals. In one embodiment, an interface for the wireless antenna 778 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, the volatile memory 732 includes, but is not limited to, Synchronous Dynamic Random Access Memory (SDRAM), Dynamic Random Access Memory (DRAM), RAMBUS Dynamic Random Access Memory (RDRAM), or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In one embodiment, the memory 730 may also store temporary variables or other intermediate information while the processor 710 is executing instructions. In the illustrated embodiment, the chipset 720 connects with the processor 710 via Point-to-Point (PtP or P-P) interfaces 717, 722. The chipset 720 enables the processor 710 to connect to other elements in the system 700. In some embodiments of the example system, the interfaces 717, 722 operate in accordance with a PtP communication protocol such as the Intel® QuickPath Interconnect (QPI) or the like. In other embodiments, a different interconnect may be used.

In some embodiments, the chipset 720 is operable to communicate with one or more of the processors 710, 705, a display device 740, and other devices, including a bus bridge 772, a smart TV 776, I/O devices 774, a nonvolatile memory 760, a storage medium 762 (such as one or more mass storage devices) 762, a keyboard/mouse 764, a network interface 766, and various forms of consumer electronics 777 (such as a PDA, smart phone, tablet, etc.), etc. In one embodiment, the chipset 720 couples with these devices through an interface 724. The chipset 720 may also be coupled to a wireless antenna 778 to communicate with any device configured to transmit and/or receive wireless signals.

The chipset 720 connects to the display device 740 via the interface 726. The display device 740 may be, for example, a liquid crystal display (LCD), a light emitting diode (LED) array, an organic light emitting diode (OLED) array, or any other form of visual display device. In some embodiments of the example system 700, the processor 710 and the chipset 720 are merged into a single SOC. In addition, the chipset 720 connects to one or more buses 750, 755 that interconnect various system elements, such as the I/O devices 774, the nonvolatile memory 760, the storage medium 762, the keyboard/mouse 764, and the network interface 766. The buses 750, 755 may be interconnected together via the bus bridge 772.

In one embodiment, the storage medium 762 includes, but is not limited to, a solid-state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although the cache memory 716 is depicted as a separate block within the processor 710, the cache memory 716 (or selected aspects of the cache memory 716) can be incorporated into the processor core 712.

As noted above, various embodiments of the capacitors described herein may be implemented with one or more of the devices of the system 700. The capacitors are described with reference to forming one or more components of a noise suppression filter for a PDN. However, the person of ordinary skill in the art will recognize, upon reading and understanding the disclosure provided herein, that one or more of the various embodiments can be used in any situation calling for a capacitor having a large-capacitance value, especially if space for the capacitor is limited.

Therefore, the description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other of the capacitor embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to a skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A capacitor device, comprising:
a first conductive plate disposed on a first lateral layer and a second conductive plate disposed on a second lateral layer parallel to the first lateral layer;
a dielectric material formed between the first conductive plate and the second conductive plate;
a first layer dielectric material disposed on the first lateral layer on opposing lateral sides of the first conductive plate;
a second layer dielectric material disposed on the second lateral layer on lateral opposing sides of the second conductive plate; and
a floating conductive fill layer formed within the dielectric material, the floating conductive fill layer within the dielectric material disposed only in an area between the first conductive plate and the second conductive plate, the floating conductive fill layer parallel to the first and second lateral layers.

2. The capacitor device of claim 1, wherein the floating conductive fill layer comprises a plurality of individual conductive elements arranged substantially in a single plane.

3. The capacitor device of claim 1, wherein the floating conductive fill layer comprises a plurality of individual conductive elements arranged in a plurality of rows, each of the plurality of rows being substantially in the same plane as other individual conductive elements in the same row.

4. The capacitor device of claim 1, wherein the floating conductive fill layer comprises a plurality of individual conductive elements arranged in a plurality of rows, each of the plurality of rows being substantially in different planes from others of the plurality of rows.

5. The capacitor device of claim 1, further comprising one or more additional capacitor devices formed within the dielectric material and formed between the first conductive plate and the second conductive plate.

6. The capacitor device of claim 5, wherein the one or more additional capacitor devices are formed laterally adjacent to the floating conductive fill layer.

7. The capacitor device of claim 5, wherein additional floating conductive lines are formed laterally between at least one of the one or more additional capacitor devices.

8. The capacitor device of claim 5, wherein:
the one or more additional capacitor devices each comprise an upper conductive plate and a lower conductive plate,
the upper conductive plate is electrically coupled to the first conductive plate and is parallel to the first and second lateral layers, and
the lower conductive plate is electrically coupled to the second conductive plate and is parallel to the first and second lateral layers.

9. The capacitor device of claim 8, wherein the upper conductive plate and the lower conductive plate of the one or more additional capacitor devices include a portion of the dielectric material located between the upper conductive plate and the lower conductive plate.

10. The capacitor device of claim 1, wherein at least one of the first conductive plate and the second conductive plate is a redistribution layer.

11. The capacitor device of claim 1, wherein at least one of the first layer dielectric material and second layer dielectric material is formed from a different material than the dielectric material formed between the first conductive plate and the second conductive plate.

12. The capacitor device of claim 1, wherein the first layer dielectric material and second layer dielectric material are formed from the same material as the dielectric material formed between the first conductive plate and the second conductive plate.

13. The capacitor device of claim 1, wherein the first layer dielectric material and second layer dielectric material are formed from the same material.

14. The capacitor device of claim 1, wherein the first layer dielectric material and second layer dielectric material are formed from different materials.

15. The capacitor device of claim 1, wherein:
the first conductive plate is connected, through a lower via in a lower dielectric material, to a first lower electrical trace disposed on an opposite side of the first conductive plate as the floating conductive fill layer,
the first conductive plate is connected through the first lower electrical trace to:

a die through a die interconnect, and
a first upper electrical trace disposed on an opposite side of the second conductive plate as the floating conductive fill layer and separated from the first conductive plate by an upper dielectric material, the first lower electrical trace connected to the first upper electrical trace through a capacitor via in the dielectric material, the lower dielectric material, and the upper dielectric material,
the second conductive plate is connected, through an upper via in the upper dielectric material, to a second upper electrical trace disposed in the same plane as the first upper electrical trace,
the second conductive plate is connected through the second upper electrical trace to:
a second lower electrical trace disposed in the same plane as the first lower electrical trace, the second upper electrical trace connected to the second lower electrical trace through another capacitor via in the dielectric material, the lower dielectric material, and the upper dielectric material, and
the die through a die interconnect connected to the second lower electrical trace,
the capacitor via and the other capacitor via are laterally separated from the first and second conductive plates by the first layer dielectric material and the second layer dielectric material, and
the first upper electrical trace is isolated from the second conductive plate, and the second lower electrical trace is isolated from the first conductive plate.

16. The capacitor device of claim 15, wherein the floating conductive fill layer is connected to at least one of the first conductive plate or second conductive plate through conductive vias disposed in the dielectric material.

17. A capacitor device, comprising:
a main capacitor having:
a first conductive plate disposed on a first lateral layer and a second conductive plate disposed on a second lateral layer parallel to the first lateral layer; and
a dielectric material formed between the first conductive plate and the second conductive plate; and
one or more smaller capacitors formed within the dielectric material and between the first conductive plate and the second conductive plate, each of the one or more smaller capacitors having:
an upper conductive plate disposed on a third lateral layer parallel to the first lateral layer; and
a lower conductive plate disposed on a fourth lateral layer parallel to the first lateral layer, the upper conductive plate being electrically coupled to the first conductive plate and the lower conductive plate being electrically coupled to the second conductive plate,
wherein the first conductive plate is connected, through a lower via in a lower dielectric material, to a first lower electrical trace disposed on an opposite side of the first conductive plate as the second conductive plate,
the first conductive plate is connected through the first lower electrical trace to:
a die through a die interconnect, and
a first upper electrical trace disposed on an opposite side of the second conductive plate as the first conductive plate and separated from the first conductive plate by an upper dielectric material, the first lower electrical trace connected to the first upper electrical trace through a capacitor via in the dielectric material, the lower dielectric material, and the upper dielectric material,
the second conductive plate is connected, through an upper via in the upper dielectric material, to a second upper electrical trace disposed in the same plane as the first upper electrical trace,
the second conductive plate is connected through the second upper electrical trace to:
a second lower electrical trace disposed in the same plane as the first lower electrical trace, the second upper electrical trace connected to the second lower electrical trace through another capacitor via in the dielectric material, the lower dielectric material, and the upper dielectric material, and
the die through a die interconnect connected to the second lower electrical trace,
the capacitor via and the other capacitor via are laterally separated from the first and second conductive plates by the first layer dielectric material and the second layer dielectric material, and
the first upper electrical trace is isolated from the second conductive plate, and the second lower electrical trace is isolated from the first conductive plate.

18. The capacitor device of claim 17, further comprising a floating conductive fill layer formed within the dielectric material and between the first conductive plate and the second conductive plate.

19. The capacitor device of claim 17, further comprising a floating conductive fill layer formed within the dielectric material and laterally adjacent to at least one of the upper conductive plate and the lower conductive plate.

20. The capacitor device of claim 17, further comprising a floating conductive fill layer formed within the dielectric material and between the upper conductive plate and the lower conductive plate.

21. The capacitor device of claim 17, wherein at least one of the first conductive plate and the second conductive plate is a redistribution layer.

22. The capacitor device of claim 17, wherein the floating conductive fill layer is connected to at least one of the first conductive plate or second conductive plate through conductive vias disposed in the dielectric material.

23. A noise suppression filter for a power-delivery network in a mobile device, the noise suppression filter comprising:
a main capacitor having:
a first conductive plate disposed on a first lateral layer and a second conductive plate disposed on a second lateral layer parallel to the first lateral layer; and
a dielectric material formed between the first conductive plate and the second conductive plate; and
a floating conductive fill layer formed within the dielectric material and between the first conductive plate and the second conductive plate, the floating conductive fill layer disposed on a lateral layer parallel to the first lateral layer; and
one or more smaller capacitors formed within the dielectric material and between the first conductive plate and the second conductive plate, each of the one or more smaller capacitors having:
an upper conductive plate disposed on a third lateral layer parallel to the first lateral layer; and
a lower conductive plate disposed on a fourth lateral layer parallel to the first lateral layer, the upper conductive plate being electrically coupled to the first conductive plate and the lower conductive plate being electrically coupled to the second conductive plate, wherein the first conductive plate is connected, through a lower via in a lower dielectric material, to a first lower electrical trace disposed on an opposite side of the first conductive plate as the second conductive plate, the first conductive plate is connected through the first lower electrical trace to:
- a die through a die interconnect, and
- a first upper electrical trace disposed on an opposite side of the second conductive plate as the first conductive plate and separated from the first conductive plate by an upper dielectric material, the first lower electrical trace connected to the first upper electrical trace through a capacitor via in the dielectric material, the lower dielectric material, and the upper dielectric material, the second conductive plate is connected, through an upper via in the upper dielectric material, to a second upper electrical trace disposed in the same plane as the first upper electrical trace, the second conductive plate is connected through the second upper electrical trace to:
- a second lower electrical trace disposed in the same plane as the first lower electrical trace, the second upper electrical trace connected to the second lower electrical trace through another capacitor via in the dielectric material, the lower dielectric material, and the upper dielectric material, and
- the die through a die interconnect connected to the second lower electrical trace, the capacitor via and the other capacitor via are laterally separated from the first and second conductive plates by the first layer dielectric material and the second layer dielectric material, and the first upper electrical trace is isolated from the second conductive plate, and the second lower electrical trace is isolated from the first conductive plate.

24. The noise suppression filter of claim 23, wherein the floating conductive fill layer comprises a plurality of individual conductive elements.

25. The noise suppression filter of claim 23, wherein at least one of the first conductive plate and the second conductive plate is a redistribution layer.

* * * * *